(12) United States Patent
Cheng et al.

(10) Patent No.: US 9,041,155 B2
(45) Date of Patent: May 26, 2015

(54) SEMICONDUCTOR STRUCTURE

(71) Applicant: UNITED MICROELECTRONICS CORP., Hsin-Chu (TW)

(72) Inventors: Chao-Sheng Cheng, Taichung (TW); Kai-Ling Chiu, Pingtung County (TW); Chih-Yu Tseng, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 149 days.

(21) Appl. No.: 14/020,905

(22) Filed: Sep. 9, 2013

(65) Prior Publication Data

US 2014/0008762 A1 Jan. 9, 2014

Related U.S. Application Data

(62) Division of application No. 13/532,786, filed on Jun. 26, 2012, now Pat. No. 8,558,346.

(51) Int. Cl.
*H01L 21/02* (2006.01)
*H01L 49/02* (2006.01)
*H01L 23/522* (2006.01)
*H01L 27/08* (2006.01)
*H01L 27/02* (2006.01)

(52) U.S. Cl.
CPC ............ *H01L 28/40* (2013.01); *H01L 23/5223* (2013.01); *H01L 27/0207* (2013.01); *H01L 27/0805* (2013.01); *H01L 28/88* (2013.01); *H01L 23/5225* (2013.01)

(58) Field of Classification Search
USPC .......................................... 257/532
See application file for complete search history.

(56) References Cited

U.S. PATENT DOCUMENTS

| 7,923,817 | B2 | 4/2011 | Chen et al. |
| 2007/0296013 | A1 | 12/2007 | Chang et al. |
| 2010/0140741 | A1 | 6/2010 | Liang et al. |

*Primary Examiner* — Anthony Ho
(74) *Attorney, Agent, or Firm* — Winston Hsu; Scott Margo

(57) ABSTRACT

A semiconductor structure includes a first capacitor and a second capacitor. The first capacitor includes a plurality of first units and each first unit includes a plurality of first finger electrodes. The second capacitor includes a plurality of second units and each second unit includes a plurality of second finger electrodes. The first units and the second units are alternately arranged to form an array. The semiconductor structure further includes a plurality of first connecting lines and a plurality of second connecting lines being parallel with each other. The first connecting lines are electrically connected to the first finger electrodes, and the second connecting lines are electrically connected to the second finger electrodes. The first finger electrodes and its adjacent first connecting lines form a straight line, and the second finger electrodes and its adjacent second connecting lines form another straight line.

4 Claims, 13 Drawing Sheets

SEMICONDUCTOR STRUCTURE

CROSS REFERENCE TO RELATED APPLICATIONS

This application is a divisional of application Ser. No. 13/532,786 filed Jun. 26, 2012, and included herein by reference.

BACKGROUND OF THE INVENTION

1. Field of the Invention

The present invention relates to a semiconductor structure, and more particularly, to a semiconductor capacitor structures with improved mismatch performance.

2. Description of the Prior Art

In modern integrated circuits (ICs), capacitors are prevalently used. For example, in applications of analog devices, the capacitors usually used include the metal-insulator-metal (MIM) capacitor and the metal-oxide-metal (MOM) capacitor. Capacitances of the capacitors are very sensitive to the fabrication process and structure design. And the capacitors always suffer the capacitor mismatch issue, and thus accuracy of the resulting digital signals is adversely impacted.

Therefore, a capacitor structure with improved mismatch performance is still in need.

SUMMARY OF THE INVENTION

According to an aspect of the present invention, a semiconductor structure is provided. The semiconductor structure includes a first capacitor formed in a first layer, the first capacitor comprising a plurality of first units and each first unit further comprising a plurality of first finger electrodes; a second capacitor formed in the first layer, the second capacitor comprising a plurality of second units, the second units and the first units being alternately arranged to form an array, and each second unit includes a plurality of second finger electrodes; a plurality of first connecting lines formed in the first layer, the first connecting lines being electrically connected to the first finger electrodes, and the first finger electrodes and its adjacent first connecting lines forming a straight line; and a plurality of second connecting lines formed in the first layer, the second connecting lines being parallel with the first connecting lines and electrically connected to the second finger electrodes, and the second finger electrodes and its adjacent second connecting lines forming a straight line.

According to another aspect of the present invention, a semiconductor structure is provided. The semiconductor structure includes a plurality of first finger electrodes formed in a first layer and a second layer; a plurality of second finger electrodes formed in the first layer and the second layer; a plurality of common finger electrodes formed in the first layer and the second layer, the common finger electrodes and the first finger electrodes being interdigitated to form a plurality of first units in the first layer and the second layer, and the common finger electrodes and the second finger electrodes are interdigitated to form a plurality of second units in the first layer and the second layer; a plurality of first connecting lines formed in the first layer, the first connecting lines being electrically connected to two nearest first finger electrodes of different first units; and a plurality of second connecting lines formed in the second layer, the second connecting lines being electrically connected to two nearest second finger electrodes of different second units, and the first connecting lines and the second connecting lines being parallel with each other.

According to the semiconductor structures provided by present invention, the connecting lines provided to electrically connect the finger electrodes are all parallel with each other, therefore the reliability of the capacitor is improved without adversely impacting the capacitor mismatch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
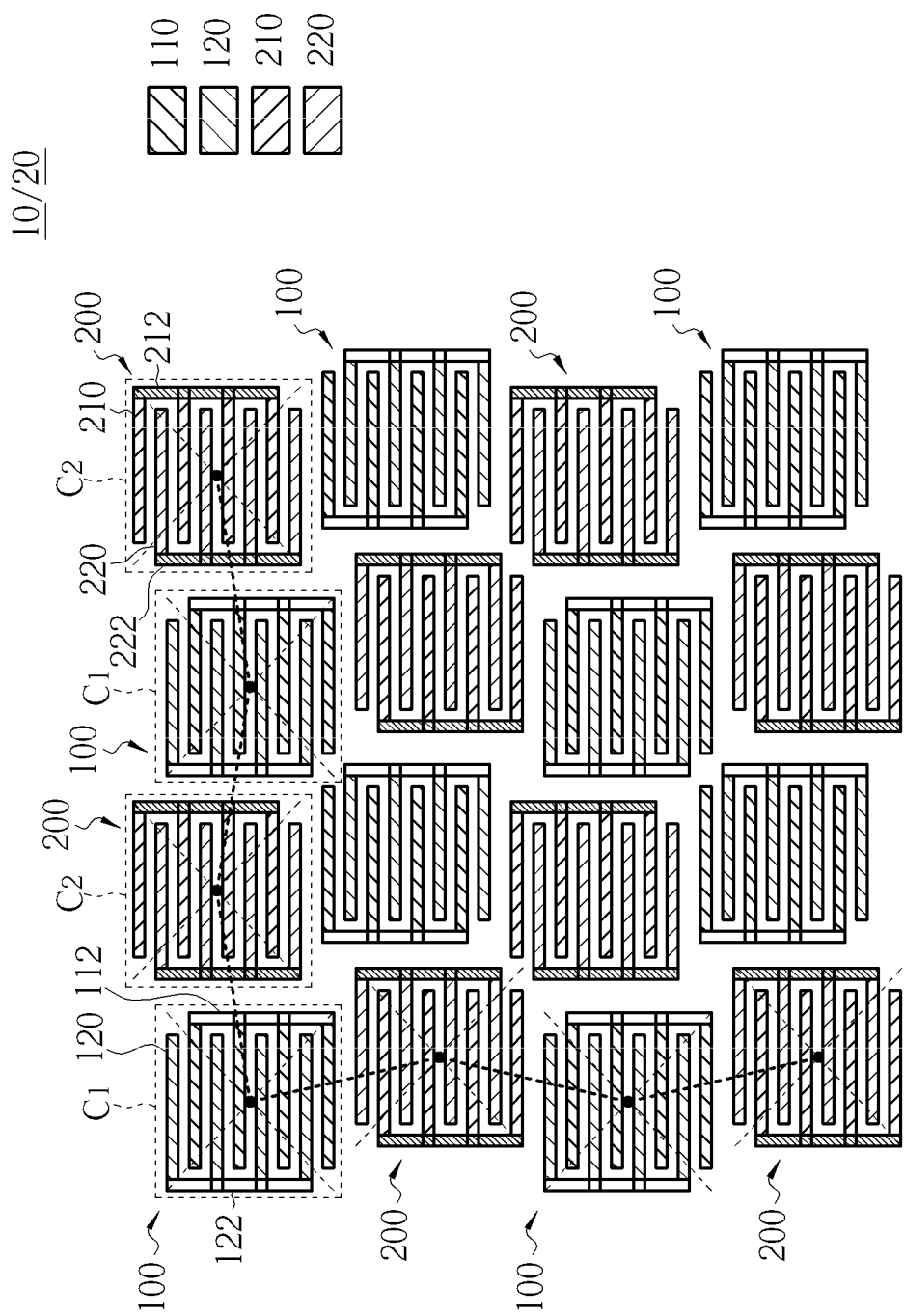
FIGS. 1-3 are schematic drawings illustrating a semiconductor structure provided by a first preferred embodiment of the present invention.
Figure 2:
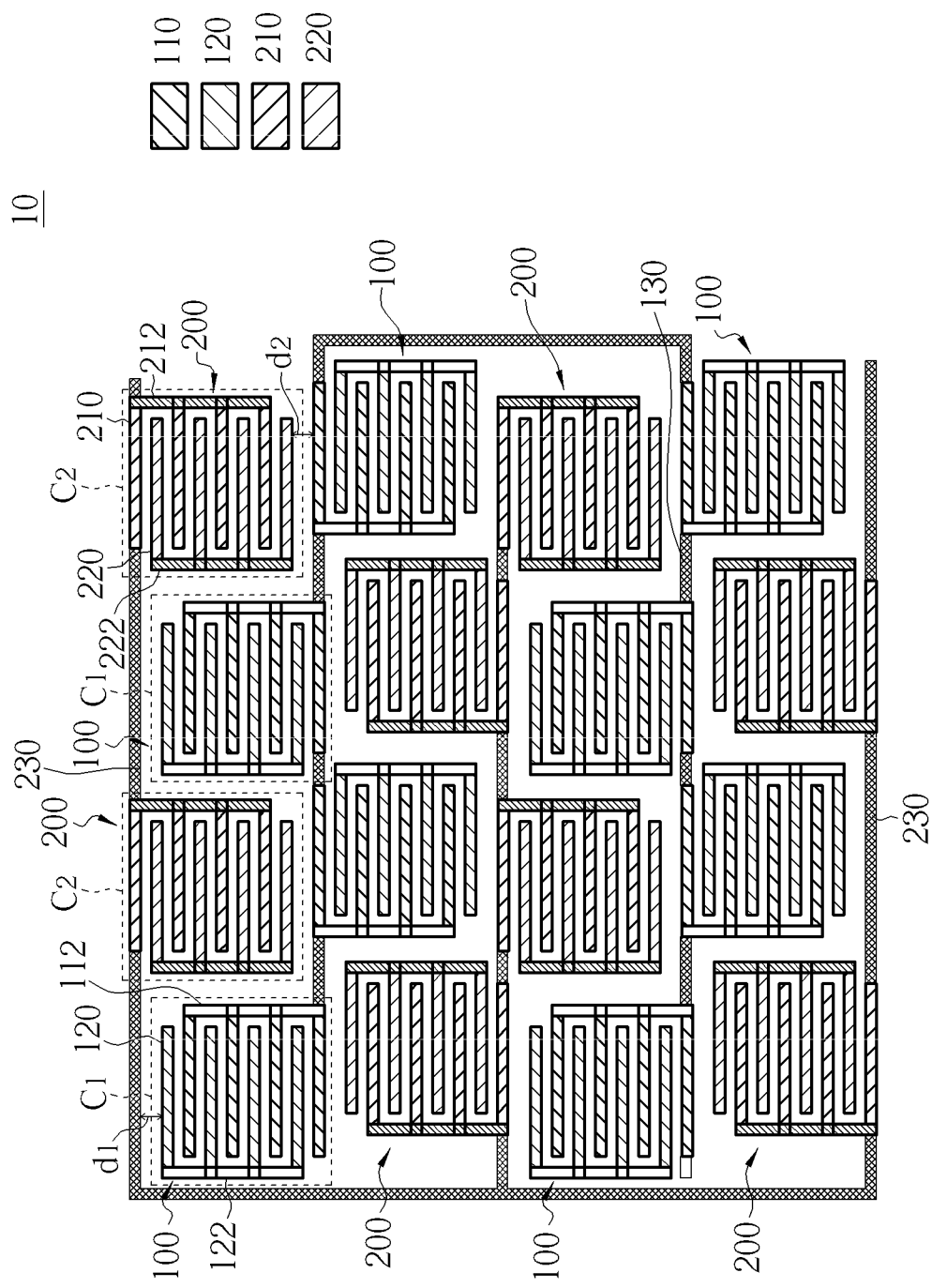
Figure 3:
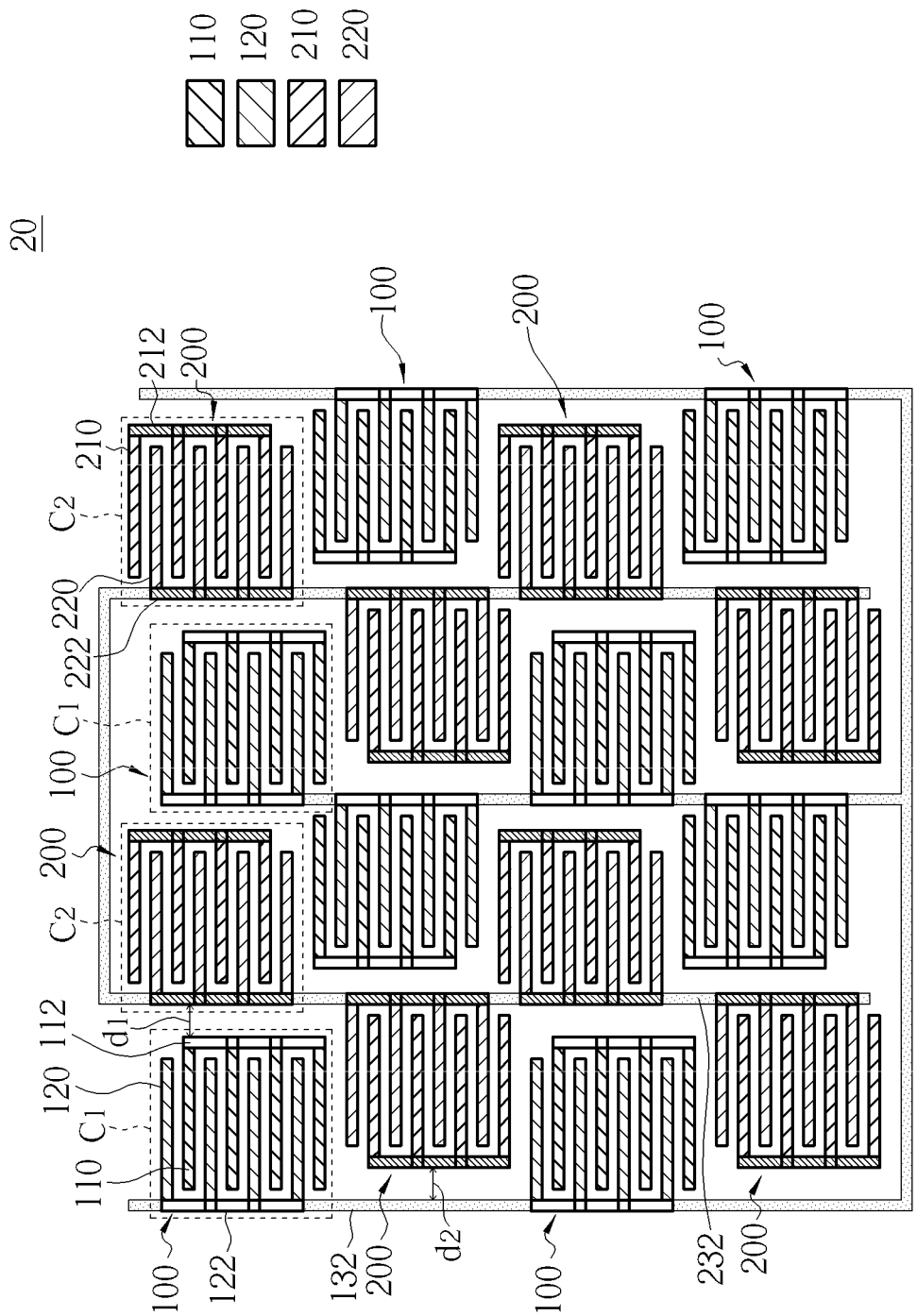

Please refer to FIGS. 1-3 which are schematic drawings illustrating a semiconductor structure provided by a first preferred embodiment of the present invention. As shown in FIG. 1, the first preferred embodiment provides a first capacitor $C_1$ and a second capacitor $C_2$. The first capacitor $C_1$ includes a plurality of first units 100 and the second capacitor $C_2$ includes a plurality of second units 200, respectively. According to the preferred embodiment, an amount of the first units 100 and an amount of the second units 200 are the same. In other words, an amount ratio between the first units 100 and the second units 200 is equal to 1. As shown in FIG. 1, each of the first units 100 includes a plurality of first finger electrodes 110 and a plurality of third finger electrodes 120, and the first finger electrodes 110 and the third finger electrodes 120 are interdigitated to form said first unit 100. In the same concept, each of the second units 200 includes a plurality of second finger electrodes 210 and a plurality of fourth finger electrodes 220, and the second finger electrodes 210 and the fourth finger electrodes 220 are interdigitated to form said second unit 200. Furthermore, the first finger electrodes 110 in one first unit 100 are electrically connected to each other by a first electrode 112 and thus obtains a comb shape. In the same concept, the third finger electrodes 120 in one first unit 100 are electrically connected to each other by a third electrode 122 and thus obtains a comb shape, the second finger electrodes 210 in one second unit 200 are electrically connected to each other by a second electrode 212 and thus obtains a comb shape, and the fourth finger electrodes 220 in one second unit 200 are electrically connected to each other by a fourth electrode 222 and thus obtains a comb shape. The first units 100 and the second units 200 are formed in a first layer 10 and a second layer 20. In other words, the first finger electrodes 110 and the third finger electrodes 120 are positioned in both of the first layer 10 and the second layer 20. In the same concept, the second finger electrodes 210 and the fourth finger electrodes 220 are positioned in both of the first layer 10 and the second layer 20. The first layer 10 and the second layer can be, for example but not limited to, a first layer (M1) and a second layer (M2) for the multi-layered metal interconnections in the back-end-of-line process.

Please still refer to FIG. 1. The first units 100 formed in the first layer 10 have an arrangement and locations the same with the first units 100 formed in the second layer 20. Also, the second units 200 formed in the first layer 10 have an arrangement and locations the same with the second units 200 formed in the second layer 20. It is noteworthy that the first units 100 and the second units 200 formed in the first layer 10 are alternately arranged to form an array and so are the first units 100 and the second units 200 formed in the second layer 20. As shown in FIG. 1, the array formed by the first units 100 and the second units 200 includes a plurality of columns and row. It should be noted that central points of the first units 100 and central points of the second units 200 in the same row form a piecewise linear line, and central points of the first units 100 and central points of the second units 200 in the same column form a piecewise linear line as shown in FIG. 1. Furthermore, the first finger electrodes 110 and the third finger electrodes 120 of the first units 100 arranged in the adjacent rows have different arrangement order. For example, in the first units 100 formed in the odd-row, the arrangement order of the first finger electrodes 110 and the third finger electrodes 120 is: the third finger electrode 120-the first finger electrode 110-the third finger electrode 120-the first finger electrode 110 . . . -the third finger electrode 120-the first finger electrode 110. However, in the first units 100 formed in the even-row, the arrangement order of the first finger electrodes 110 and the third finger electrodes 120 is: the first finger electrode 110-the third finger electrode 120-the first finger electrode 110-the third finger electrode 120 . . . -the first finger electrode 110-the third finger electrode 120. In the same concept, the second finger electrodes 210 and the fourth finger electrodes 220 of the second units 200 arranged in the adjacent rows have different arrangement order. For example, in the second units 200 formed in the odd-row, the arrangement order of the second finger electrodes 210 and the fourth finger electrodes 220 is: the second finger electrode 210-the fourth finger electrode 220-the second finger electrode 210-the fourth finger electrode 220- . . . -the second finger electrode 210-the fourth finger electrode 220. However in the second units 200 formed in the even-rows, the arrangement order of the second finger electrodes 210 and the fourth finger electrodes 220 is: the fourth finger electrode 220-the second finger electrode 210-the fourth finger electrode 220-the second finger electrode 210 . . . -the fourth finger electrode 220-the second finger electrode 210.

Please refer to FIG. 2. The semiconductor structure provided by the preferred embodiment further includes a plurality of first connecting lines 130 formed in the first layer 10. The first connecting lines 130 are electrically connected to the first finger electrodes 110. In other words, the first finger electrodes 110 are electrically connected to each other by the first electrodes 112 and the first connecting lines 130. More important, the first finger electrodes 110 and its adjacent first connecting lines 130 are parallel with each other and further form a straight line as shown in FIG. 2. It is noteworthy that by connecting the first finger electrodes 110 through the first connecting lines 130, the first units 100 in adjacent rows are electrically connected. Additionally, the electrically connected first units 100 are alternately arranged along the first connecting lines 130 like alternate leaves. Also, the semiconductor structure provided by the preferred embodiment includes a plurality of second connecting lines 230 formed in the first layer 10. The second connecting lines 230 are electrically connected to the second finger electrodes 210. In other words, the second finger electrodes 210 are electrically connected to each other by the second electrodes 212 and the second connecting lines 230. More important, the second finger electrodes 210 and its adjacent second connecting lines 230 are parallel with each other and further form a straight line as shown in FIG. 2. By connecting the second finger electrodes 210 through the second connecting lines 230, the second units 200 in adjacent rows are electrically connected. Additionally, the electrically connected second units 200 are alternately arranged along the second connecting lines 230 like alternate leaves. More important, the first connecting lines 130 and the second connecting lines 230 are parallel with each other as shown in FIG. 2.

Please refer to FIG. 3. The semiconductor structure provided by the preferred embodiment further includes a plurality of third connecting lines 132 formed in the second layer 20. The third connecting lines 132 are perpendicular to the third finger electrodes 120. By connecting the third electrodes 122, which electrically connected to the third finger electrodes 120, and the third connecting lines 132, the first units 100 in adjacent columns are electrically connected. In other words, the third finger electrodes 120 are electrically connected to each other by third electrodes 122 and the third connecting lines 132. Additionally, the electrically connected first units 100 are alternately arranged along the third connecting lines 132 like alternate leaves. Also, the semiconductor structure of the preferred embodiment includes a plurality of fourth connecting lines 232 formed in the second layer 20. The fourth connecting lines 232 are perpendicular to the fourth finger electrodes 220. By connecting the fourth electrodes 222, which electrically connected to the fourth finger electrodes 220, and the fourth connecting lines 232, the second units 200 in adjacent columns are electrically connected. In other words, the fourth finger electrodes 220 are electrically connected to each other by the fourth electrodes 222 and the fourth connecting lines 232. Additionally, the electrically connected second units 200 are alternately arranged along the fourth connecting lines 232 like alternate leaves. More important, the third connecting lines 132 and the fourth connecting lines 232 are parallel with each other as shown in FIG. 3.

According to the semiconductor structure provided by the first preferred embodiment, the connecting lines that used to electrically connect the capacitor units 100/200 are parallel with or perpendicular to the finger electrodes and thus are different from the prior art, in which the connecting lines used to electrically connect capacitor units are neither parallel with, nor perpendicular to the finger electrodes. In fact, the connecting lines and the finger electrodes often have an included angle of 45° in the prior art. Accordingly, the adverse impact rendered from the non-parallel and non-perpendicular designs for the connecting lines and the finger electrodes are avoided by the semiconductor structure provided by the preferred embodiment.

Additionally, the semiconductor structure provided by the first preferred embodiment includes four terminals (not shown), for example a first positive terminal $C_1+$ of the first capacitor $C_1$ in the first layer 10, a second positive terminal $C_2+$ of the second capacitor $C_2$ in the first layer 10, a first negative terminal $C_1-$ of the first capacitor $C_1$ in the second layer 20, and a second negative terminal $C_2-$ of the second capacitor $C_2$ in the second layer 20. As mentioned above, the first finger electrodes 110 are electrically connected to each other, and the first finger electrodes 110 are further electrically connected to the first positive terminal $C_1+$. In the same concept, the third finger electrodes 120 are electrically connected to each other and further electrically connected to the first negative terminal $C_1-$, the second finger electrodes 210 are electrically connected to each other and further electrically connected to the second positive terminal $C_2+$, and the fourth finger electrodes 220 are electrically connected to each other and further electrically connected to the second negative terminal $C_2-$.

Figure 4:
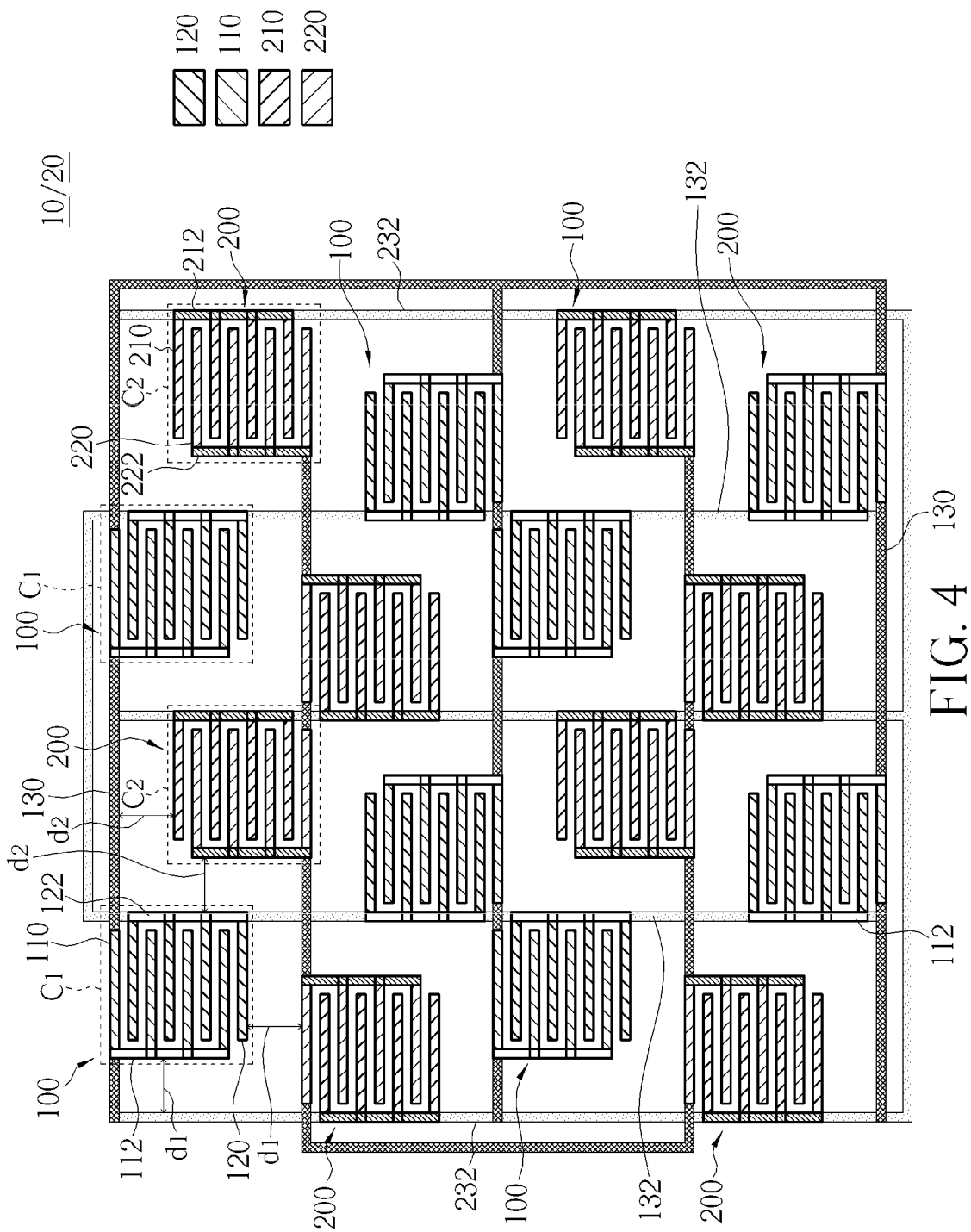
FIG. 4 is a schematic drawing of a semiconductor structure provided by a second preferred embodiment of the present invention.

Please refer to FIG. 4, which is a schematic drawing of a semiconductor structure provided by a second preferred embodiment of the present invention. It is noteworthy that elements the same in both of the first preferred embodiment and the second preferred embodiment are designated by the same numerals and the details are omitted herein in the interest of brevity. Furthermore, FIG. 4 illustrates the first capacitor $C_1$ and the second capacitor $C_2$ formed in both of the first layer 10 and the second layer 20. According to the first preferred embodiment, a spacing distance $d_1$ between the first units 100 and the second connecting lines 230, and between first units 100 and the fourth connecting lines 232 are equal to or smaller than 0.6 micrometer (µm). A spacing distance $d_2$ between the second units 200 and the first connecting lines 130, and between the second units 200 and the third connecting lines 132 are also equal to or smaller than 0.6 µm. Different from the first preferred embodiment, the semiconductor structure provided by the second preferred embodiment includes a spacing distance $d_1$ between the first units 100 and the second connecting lines 230 and between the first units 100 and the fourth connecting lines 232, and the spacing distance $d_1$ is between 0.6 µm and 0.8 µm. In the same concept, a spacing distance $d_2$ between the second units 200 and the first connecting lines 130 and between the second units 200 and the third connecting lines 132 is also between 0.6 µm and 0.8 µm. In other words, the spacing distances $d_1/d_2$ between capacitor units 100/200 and adjacent capacitor units 200/100 are increased.

According to the semiconductor structure provided by the second preferred embodiment, coupling capacitance between different capacitor units 100/200 is reduced by increasing the spacing distances $d_1/d_2$, and thus capacitive crosstalk between different capacitor units 100/200 is mitigated.

Figure 5:
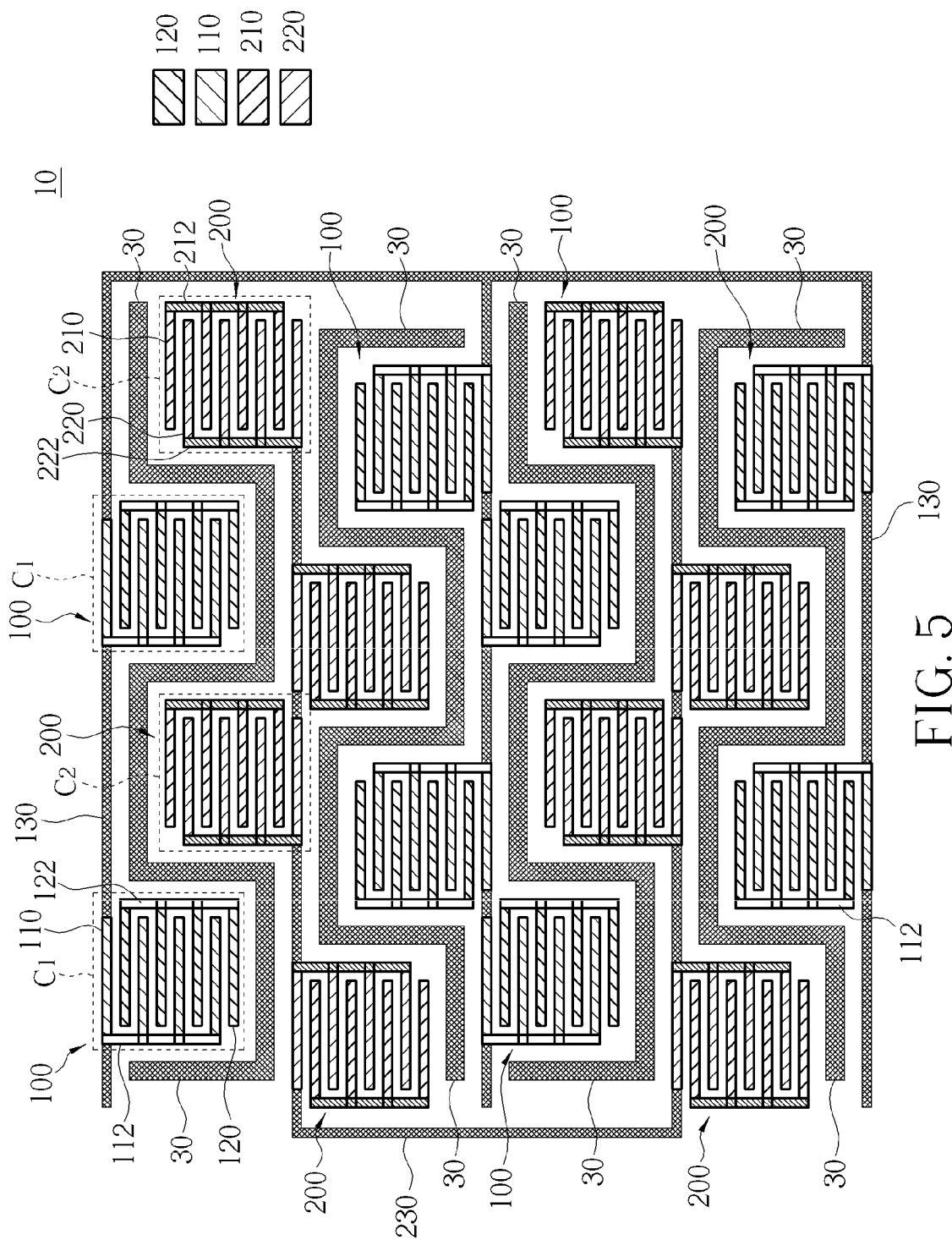
FIGS. 5-7 are schematic drawings illustrating a semiconductor structure provided by a third preferred embodiment of the present invention.
Figure 6:
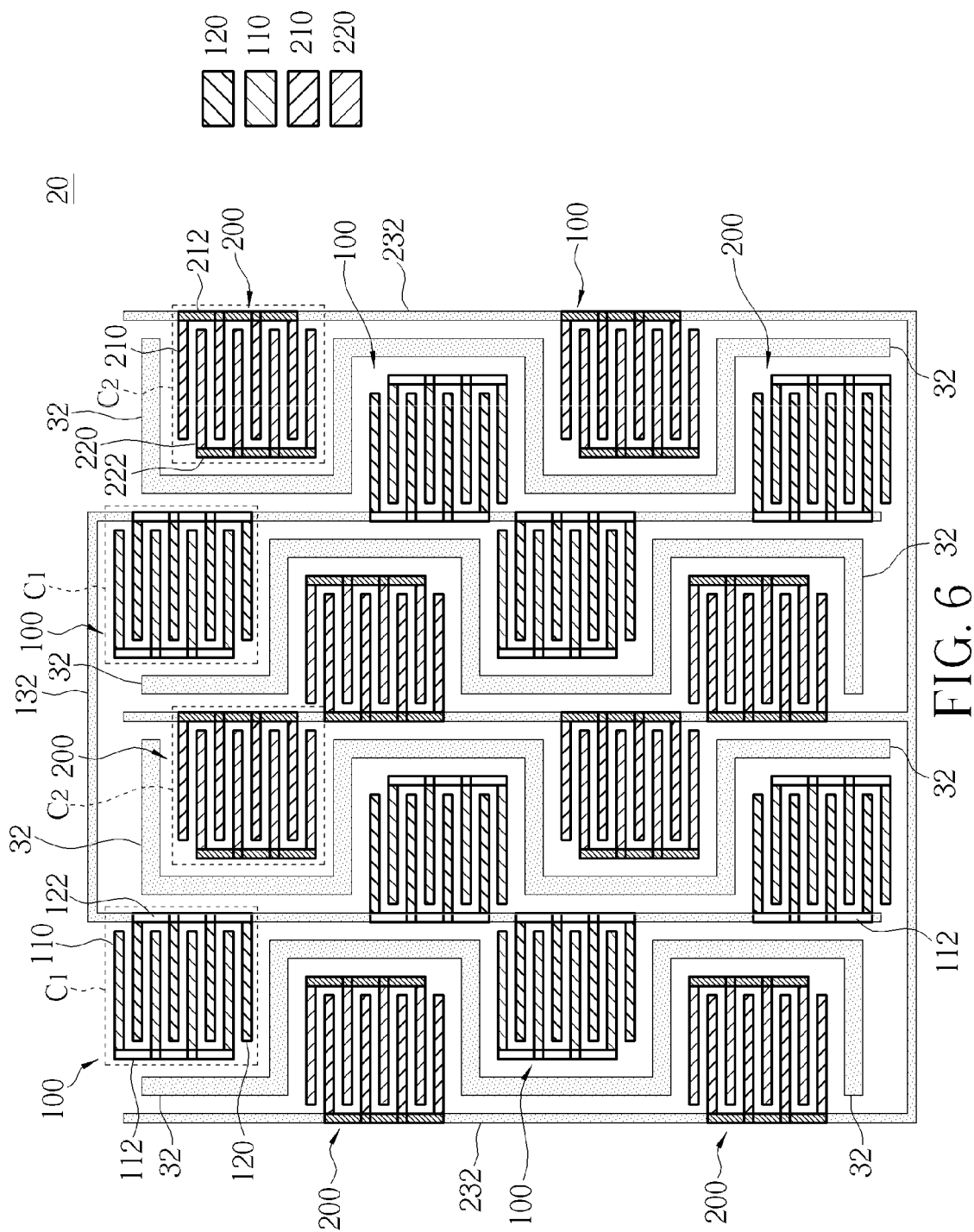
Figure 7:
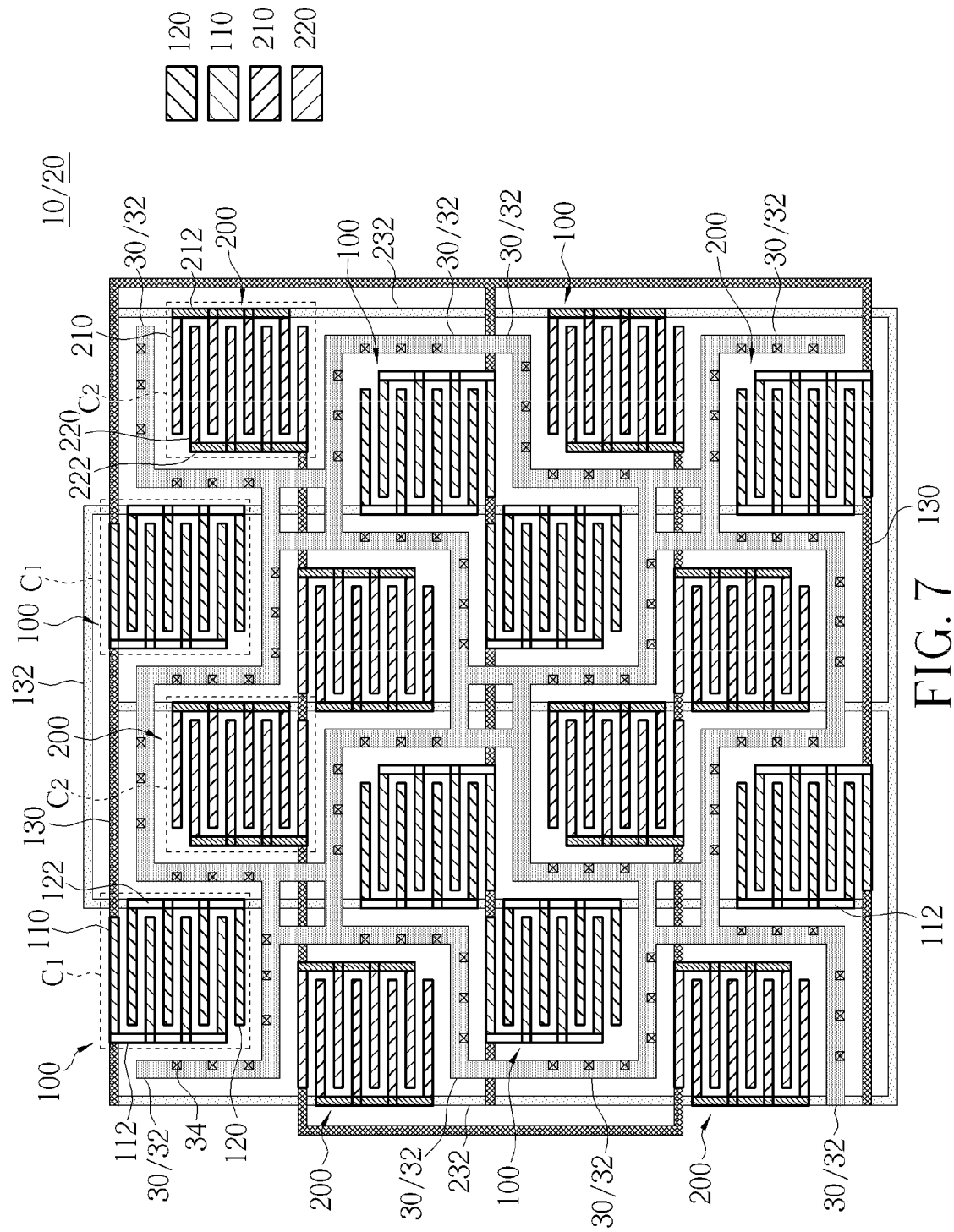

Please refer to FIGS. 5-7, which are schematic drawings illustrating a semiconductor structure provided by a third preferred embodiment of the present invention. It is noteworthy that elements the same in the abovementioned preferred embodiments and the third preferred embodiment are designated by the same numerals and the details are omitted herein in the interest of brevity. It should be noted that the spacing distances $d_1/d_2$ between the capacitor units 100/200 and adjacent capacitor units 200/100 can be increased to between 0.6 µm and 0.8 µm as described in the second preferred embodiment. The differences between the second preferred embodiment and the third preferred embodiment is: a plurality of guarding rings 30 are positioned in between the adjacent first units 100 and second units 200 in each row in the first layer 10 as shown in FIG. 5. Furthermore, a plurality of guarding rings 32 is selectively positioned in between the adjacent first units 100 and second units 200 in each column in the second layer 20 as shown in FIG. 6. As shown in FIG. 5 and FIG. 6, an extending direction of the guarding rings 30 in the first layer 10 is the same with extending directions of the first connecting lines 130 and the second connecting lines 230. And an extending direction of the guarding rings 32 in the second layer 20 is the same with extending directions of the third connecting lines 132 and the fourth connecting lines 232. The guarding rings 30/32 positioned in the layers 10/20 are electrically connected by plugs 34, and further grounded by the plugs 34 as shown in FIG. 7. Consequently, the capacitor units 100/200 are shielded by the guarding rings 30/32 and thus coupling capacitance is further reduced.

According to the semiconductor structure provided by the third preferred embodiment, coupling capacitance and capacitive crosstalk between the capacitor units 100/200 are all reduced by increasing spacing distance $d_1/d_2$ between the capacitor units 100/200 and its adjacent capacitor units 200/100 and by positioning the guarding rings 30/32.

Figure 8:
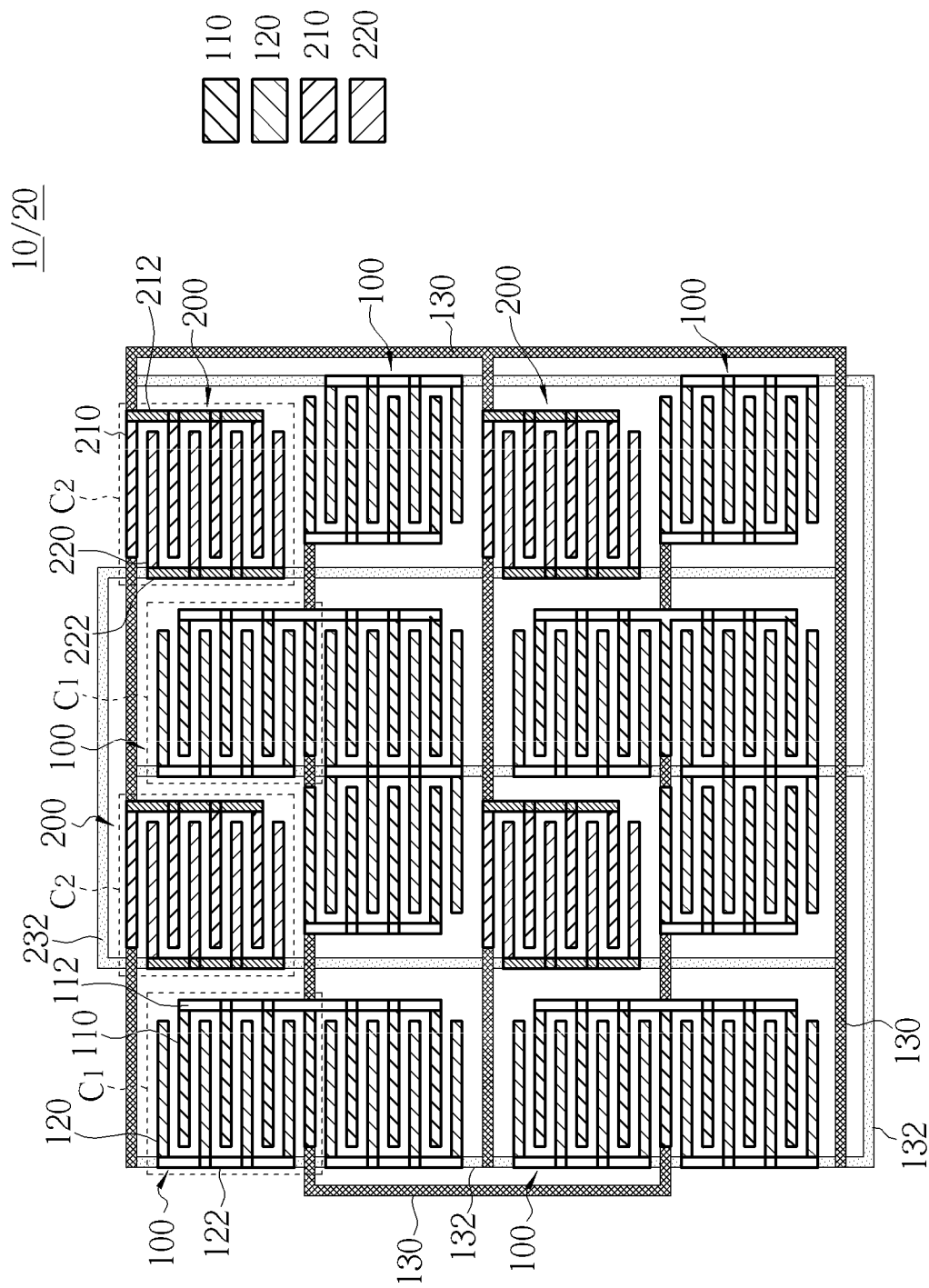
FIG. 8 is a schematic drawing of a semiconductor structure provided by a fourth preferred embodiment of the present invention.

Please refer to FIG. 8, which is a schematic drawing of a semiconductor structure provided by a fourth preferred embodiment of the present invention. It is noteworthy that elements the same in the aforementioned preferred embodiments and the fourth preferred embodiment are designated by the same numerals and the details are omitted herein in the interest of brevity. It should be noted that the semiconductor structure shown in FIG. 8 is resulted from overlapping the first layer 10 and the second layer 20. As shown in FIG. 8, the semiconductor structure provided by the preferred embodiment includes a first capacitor $C_1$ and a second capacitor $C_2$. The first capacitor $C_1$ includes a plurality of first units 100 and the second capacitor $C_2$ includes a plurality of second units 200.

As shown in FIG. 8, each of the first units 100 includes a plurality of first finger electrodes 110 and a plurality of third finger electrodes 120, and the first finger electrodes 110 and the third finger electrodes 120 are interdigitated to form said first unit 100. In the same concept, each of the second units 200 includes a plurality of second finger electrodes 210 and a plurality of fourth finger electrodes 220, and the second finger electrodes 210 and the fourth finger electrodes 220 are interdigitated to form said second unit 200. Furthermore, the first finger electrodes 110 in one first unit 100 are electrically connected to each other by a first electrode 112 and thus obtains a comb shape. In the same concept, the third finger electrodes 120 in one first unit 100 are electrically connected to each other by a third electrode 122 and thus obtains a comb shape, the second finger electrodes 210 in one second unit 200 are electrically connected to each other by a second electrode 212 and thus obtains a comb shape, and the fourth finger electrodes 220 in one second unit 200 are electrically connected to each other by a fourth electrode 222 and thus obtains a comb shape.

Please still refer to FIG. 8. The semiconductor structure provided by the preferred embodiment further includes a plurality of first connecting lines 130 formed in the first layer 10. The first connecting lines 130 are electrically connected to the first finger electrodes 110. More important, the first finger electrodes 110 and its adjacent first connecting lines 130 are parallel with each other and further form a straight line as shown in FIG. 8. The semiconductor structure also includes a plurality of second connecting lines 230 formed in the first layer 10. The second connecting lines 230 are electrically connected to the second finger electrodes 210. And the second finger electrodes 210 and its adjacent second connecting lines 230 are parallel with each other and further form a straight line as shown in FIG. 8. More important, the first connecting lines 130 and the second connecting lines 230 are parallel with each other as shown in FIG. 8.

Please refer to FIG. 8. The semiconductor structure provided by the preferred embodiment further includes a plurality of third connecting lines 132 formed in the second layer 20. The third connecting lines 132 are electrically connected to the third electrode 122 and thus electrically connected to the third finger electrodes 120. According to the preferred embodiment, the third connecting lines 132 are perpendicular to the third finger electrodes 120. Also, the semiconductor structure includes a plurality of fourth connecting lines 232 formed in the second layer 20. The fourth connecting lines 232 are electrically connected to the fourth electrode 222 and thus electrically connected to the fourth finger electrodes 220. According to the preferred embodiment, the fourth connecting lines 232 are also perpendicular to the fourth finger electrodes 220. As shown in FIG. 8, the third connecting lines 132 and the fourth connecting lines 232 are parallel with each other.

It is noteworthy that according to the preferred embodiment, an amount of the first units 100 and an amount of the second units 200 are different. In other words, the semiconductor structure of the preferred embodiment includes an amount ratio between the first units 100 and the second units 200, and the amount ratio is larger than 1. As shown in FIG. 8, the amount ratio between the first units 100 and the second units 200 is 3 in the preferred embodiment. However, the amount ratio between the first units 100 and the second units 200 can be 5 or 7, but not limited to this.

In addition, coupling capacitance and capacitive crosstalk between the capacitor units 100/200 can be reduced by increasing spacing distance $d_1/d_2$ (not shown) between the capacitor units 100/200 and its adjacent capacitor units 200/100 and by positioning the guarding rings 30/32.

According to the semiconductor structure provided by the fourth preferred embodiment, the first capacitor $C_1$ and the second capacitor $C_2$ can obtain different capacitances by modifying the amount of the first units 100 and the amount of the second units 200. In other words, by providing different wiring patterns, different capacitances can be realized and thus satisfies with different capacitance requirements of ICs.

Figure 9:
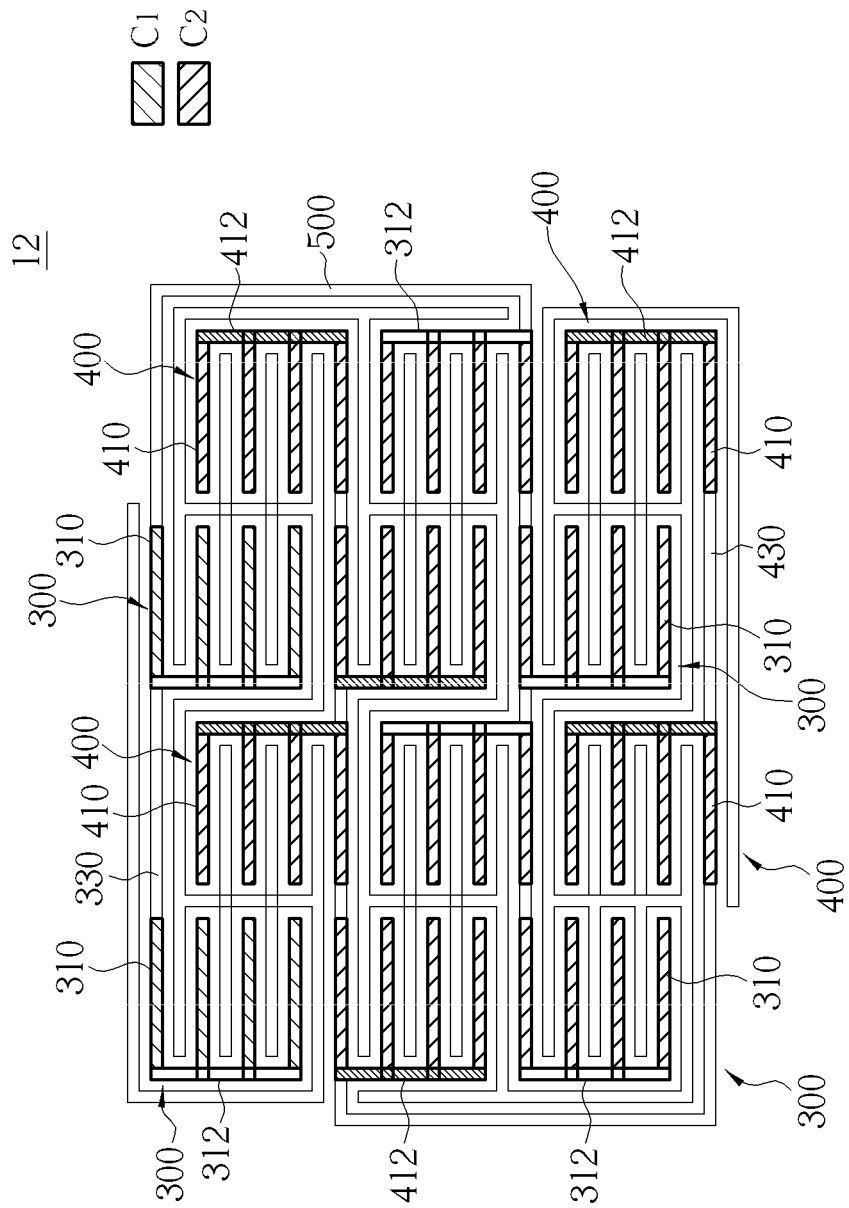
FIG. 9 is a schematic drawing of a semiconductor structure provided by a fifth preferred embodiment of the present invention.

Please refer to FIG. 9, which is a schematic drawing of a semiconductor structure provided by a fifth preferred embodiment of the present invention. As shown in FIG. 9, the fifth preferred embodiment provides a first capacitor $C_1$ and a second capacitor $C_2$. The first capacitor $C_1$ includes a plurality of first units 300 and the second capacitor $C_2$ includes a plurality of second units 400. According to the preferred embodiment, an amount of the first units 300 is the same with an amount of the second units 400. In other words, an amount ratio between the first units 300 and the second units 400 is 1. As shown in FIG. 9, each of the first units 300 includes a plurality of first finger electrodes 310 and each of the second units 400 includes a plurality of second finger electrodes 410. The first finger electrodes 310 in one first unit 300 are electrically connected to each other by a first electrode 312 and thus obtains a comb shape. In the same concept, the second finger electrodes 410 in one second unit 400 are electrically connected to each other by a second electrode 412 and thus obtains a comb shape. The first units 300 and the second units 400 are formed in a first layer 12. In other words, the first finger electrodes 310 and the second finger electrodes 410 are formed in the first layer 12. It is noteworthy that according to the preferred embodiment, the semiconductor structure further includes a plurality of common finger electrodes 500 formed in the first layer 12. The common finger electrodes 500 include a fishbone shape. As shown in FIG. 9, the common finger electrodes 500 and the first finger electrodes 310 are interdigitated to form the first units 300, while the common finger electrodes 500 and the second finger electrodes 410 are also interdigitated to form the second units 400. As shown in FIG. 9, the first units 300 and the second units 400 formed in the first layer 12 are alternately arranged to form an array, and the array includes a plurality of columns and a plurality of rows. More important, central points of the first units 300 and central points of the second units 400 in the same row form a piecewise linear line as shown in FIG. 9.

Please still refer to FIG. 9. The semiconductor structure provided by the preferred embodiment further includes a plurality of first connecting lines 330 formed in the first layer 12. The first connecting lines 330 are electrically connected to the first finger electrodes 310. In other words, the first finger electrodes 310 are electrically connected to each other by the first electrodes 312 and the first connecting layer 330. More important, the first finger electrodes 310 and its adjacent first connecting lines 330 are parallel with each other and further form a straight line as shown in FIG. 9. It is noteworthy that by connecting the first finger electrodes 310 through the first connecting lines 330, the first units 300 in the same row are electrically connected. Also, the semiconductor structure of the preferred embodiment includes a plurality of second connecting lines 430 formed in the first layer 12. The second connecting lines 430 are electrically connected to the second finger electrodes 410. In other words, the second finger electrodes 430 are electrically connected to each other by the second connecting layer 430. The second finger electrodes 410 and its adjacent second connecting lines 430 are parallel with each and further form a straight line as shown in FIG. 9. By connecting the second finger electrodes 410 through the second connecting lines 430, the second units 400 in the same row are electrically connected. More important, the first connecting lines 330 and the second connecting lines 430 are parallel with each other as shown in FIG. 9.

According to the semiconductor structure provided by the preferred embodiment, the capacitor units 300/400 are all formed in one layer 12 instead of two layers by forming the common finger electrodes 500. Thus the fabricating process is simplified. However, the first electrode 412, the second electrode 512, and the common finger electrodes 500 still can be formed in two layers if required. Furthermore, by forming via plugs respectively in the first electrode 412, the second electrode 512, and the fishbone-shaped common finger electrodes 500, the first units 300 and the second units 400 in two layers are electrically connected and thus the first capacitor $C_1$ and the second capacitor $C_2$ are still obtained.

Additionally, the semiconductor structure provided by the fifth preferred embodiment includes four terminals (not shown), for example a first positive terminal $C_1+$ of the first capacitor $C_1$, a second positive terminal $C_2+$ of the second capacitor $C_2$, and a common negative terminal $C-$ in the first layer 12. As mentioned above, the first finger electrodes 310 are electrically connected to each other, and the first finger electrodes 310 are further electrically connected to the first positive terminal $C_1+$. In the same concept, the second finger electrodes 410 are electrically connected to each other and further electrically connected to the second positive terminal $C_2+$, and the common finger electrodes 500 are electrically connected to each other and further electrically connected to the common negative terminal $C-$.

Figure 10:
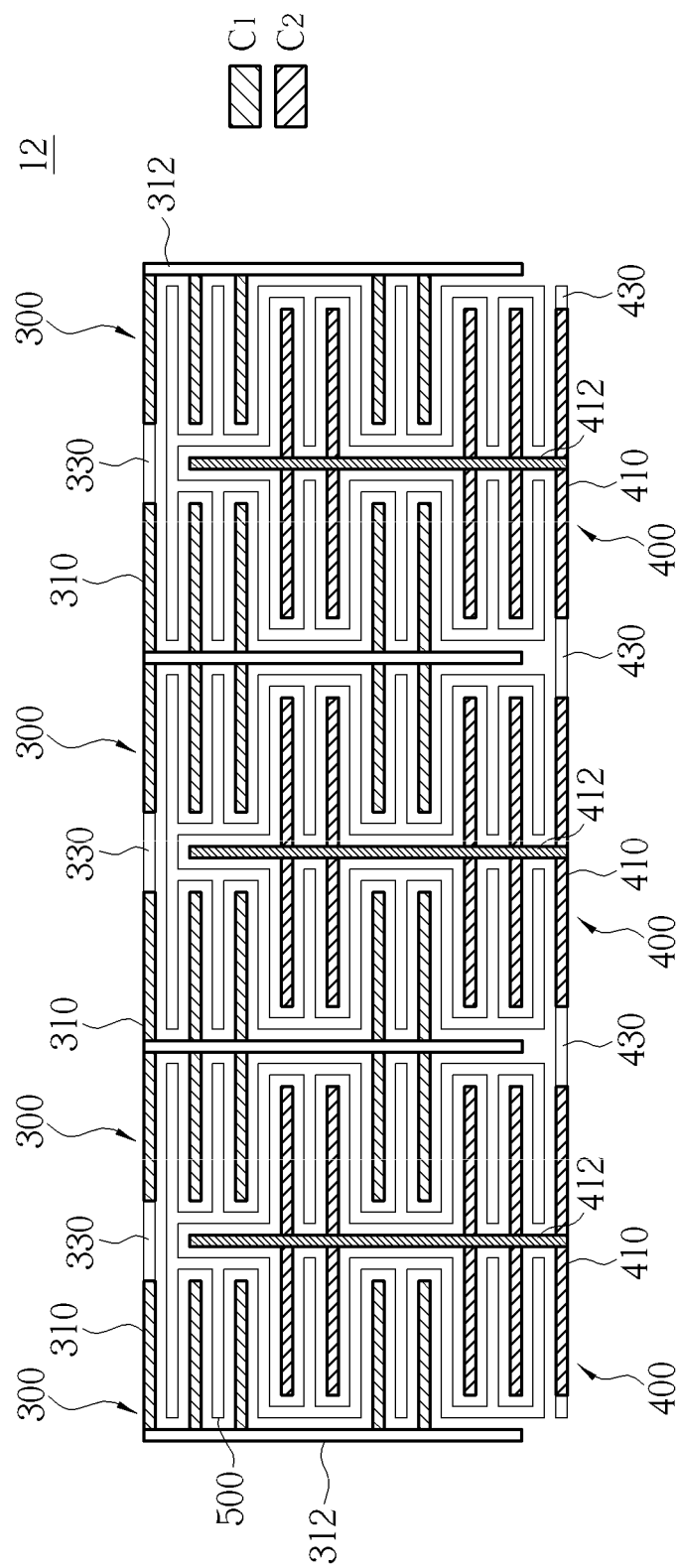
FIG. 10 is a schematic drawing of a semiconductor structure provided by a sixth preferred embodiment of the present invention.
Figure 11:
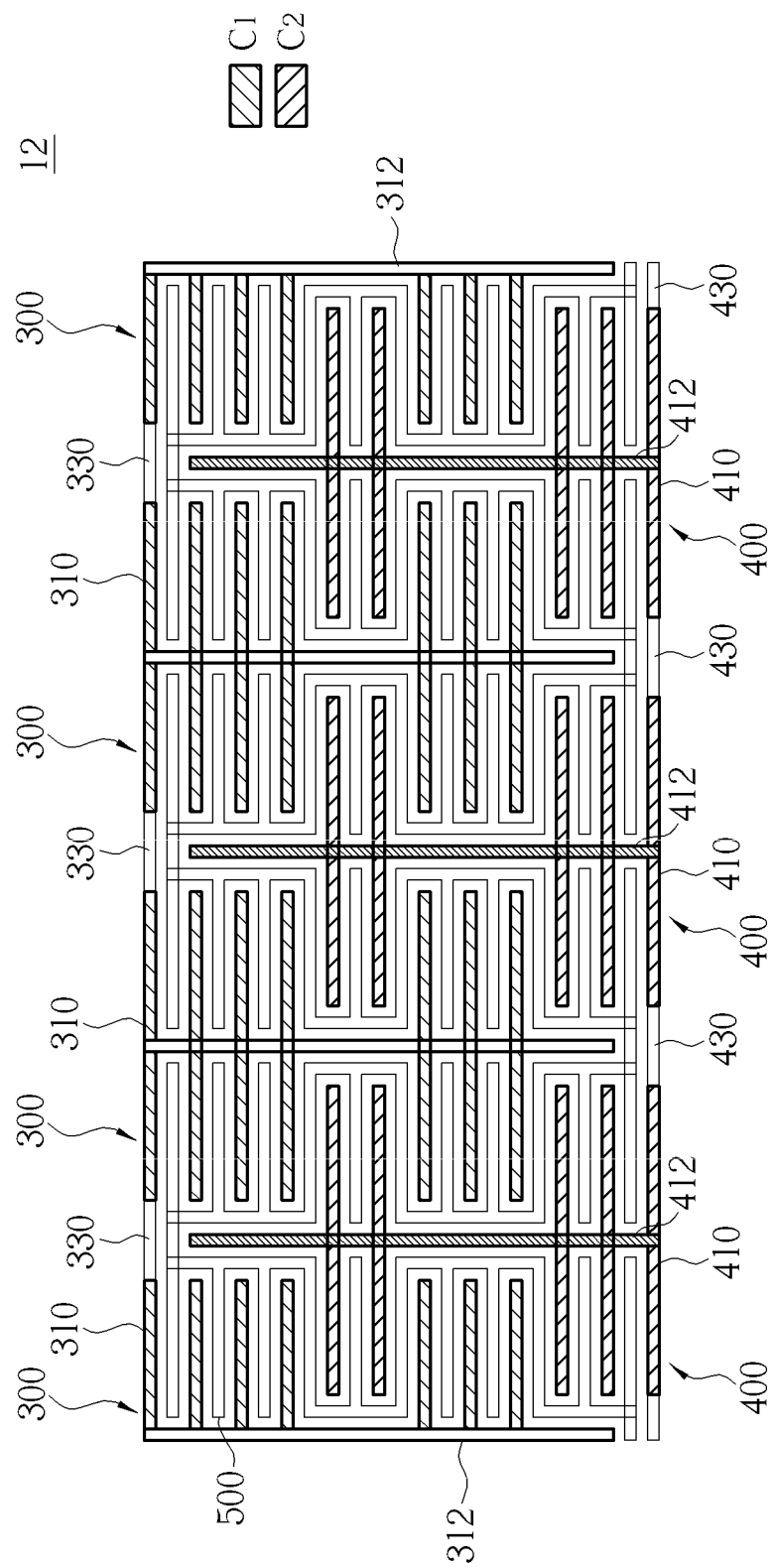
FIG. 11 is a schematic drawing of a semiconductor structure provided by a seventh preferred embodiment of the present invention

Please refer to FIGS. 10-11, wherein FIG. 10 is a schematic drawing of a semiconductor structure provided by a sixth preferred embodiment of the present invention and FIG. 11 is a schematic drawing of a semiconductor structure provided by a seventh preferred embodiment of the present invention. To understand the differences between the sixth preferred embodiment and the seventh preferred embodiment, it is more preferable to refer to FIG. 10 and FIG. 11 simultaneously. Additionally, elements the same in the fifth, the sixth and the seventh preferred embodiments are designated by the same numerals and the same details are omitted for simplicity.

The differences between the fifth and the sixth preferred embodiments is: the first finger electrodes 310 are electrically connected to each other by the first electrode 312 and thus obtain the comb shape while the second finger electrodes 410 are electrically connected to each other by the second electrode 412 and thus obtain the comb shape in the fifth preferred embodiment. Differently, the first finger electrodes 310 are electrically connected to each other by the first electrode 312 and to obtain a fishbone shape while the second finger electrodes 410 are electrically connected to each other by the second electrode 412 and to obtain a fishbone shape according to the sixth preferred embodiment. The first electrode 312 serves as the spine which electrically connects the first finger electrodes 310, and the second electrode 412 serves as the spine which electrically connects the second finger electrodes 410. Between the first finger electrodes 310 and the second finger electrodes 410, the fishbone-shaped common finger electrodes 500 are positioned. According to the preferred embodiment, an amount of the first finger electrodes 310 is the same with an amount of the second finger electrodes 410. In other words, a capacitances ratio between the first capacitor $C_1$ and the second capacitor $C_2$ is 1.

Please refer to FIG. 11. The difference between the seventh preferred embodiment and the sixth preferred embodiment is: the amount of the first finger electrodes 310 is different from the amount of the second finger electrodes 410. As shown in FIG. 11, in the same column, an amount ratio between the first finger electrodes 310 and the second finger electrodes 410 is 3:2. In other words, an amount ratio between the first finger electrodes 310 and the second finger electrodes 410 is larger than 1.

According to the sixth and seventh preferred embodiments, the capacitor units 300/400 are all formed in one layer 12 instead of two layers by forming the common finger electrodes 500. Thus the fabricating process is simplified. Furthermore, by modifying the amount of the first finger electrodes 310 and the amount of the second finger electrodes 410, the first capacitor $C_1$ and the second capacitor $C_2$ obtain different capacitances. In other words, by providing different wiring patterns, different capacitances can be realized and thus satisfies with different capacitance requirements of ICs.

Figure 12:
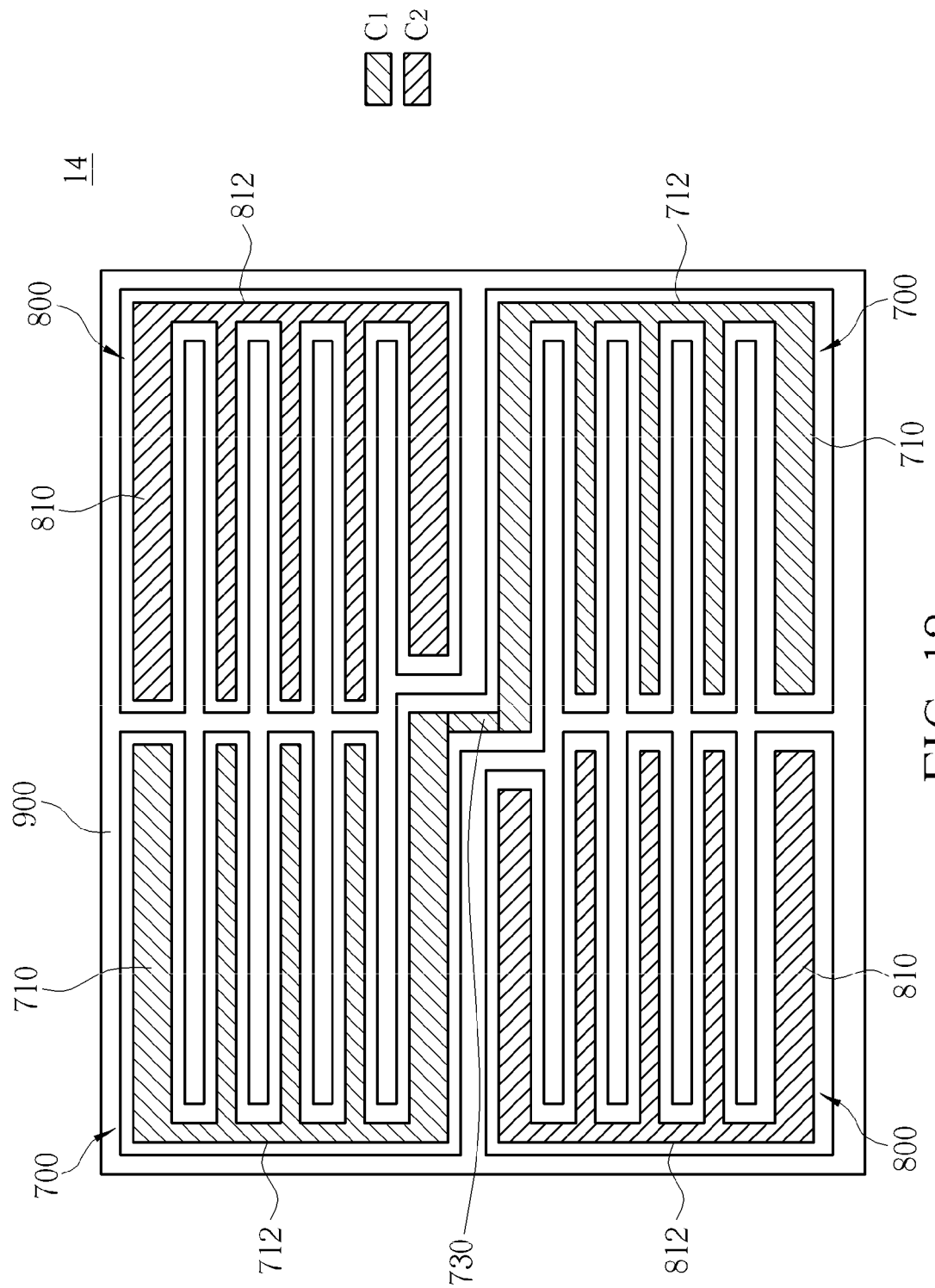
FIGS. 12-13 are schematic drawings illustrating a semiconductor structure provided by a eighth preferred embodiment of the present invention.
Figure 13:
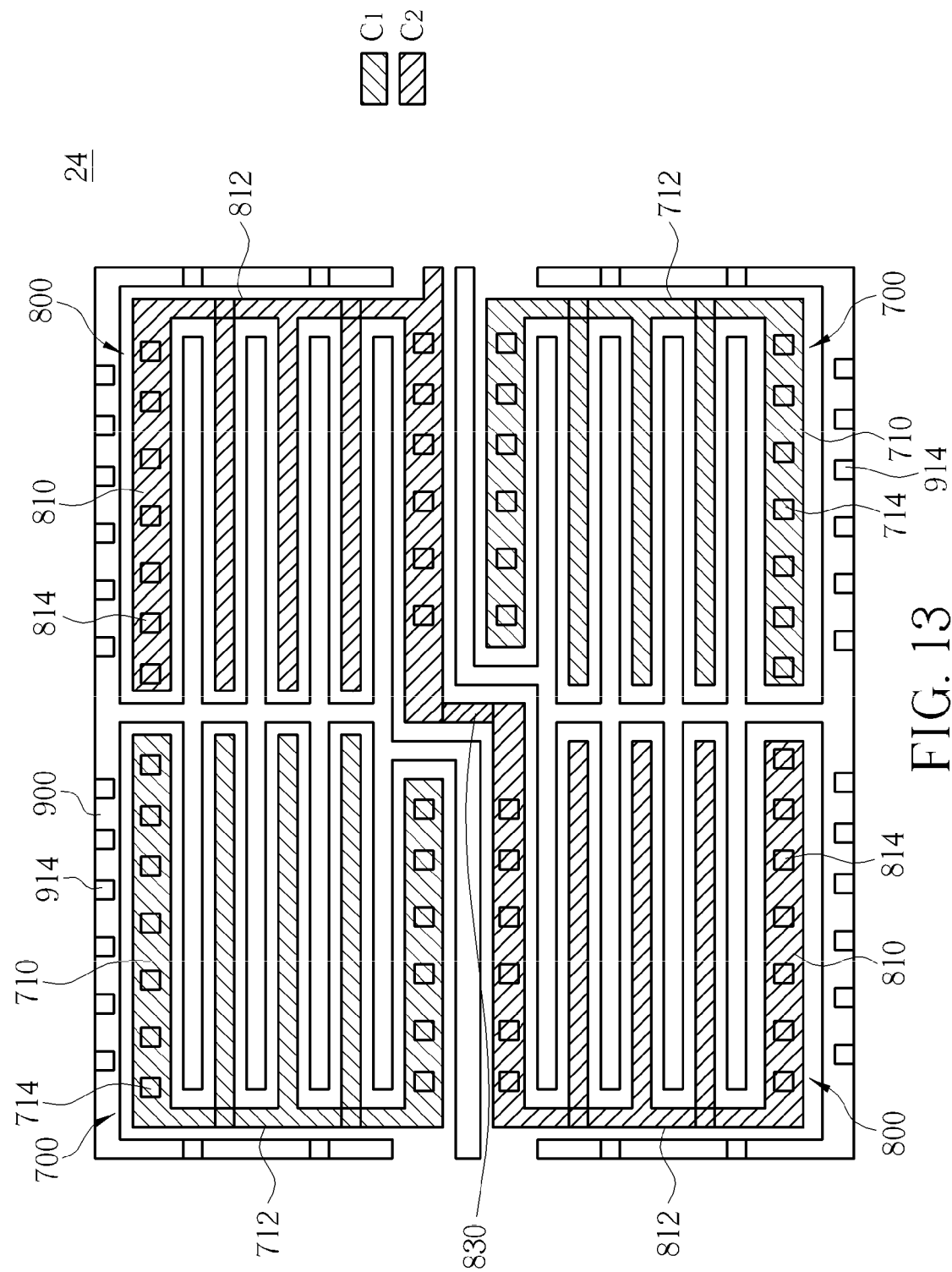

Please refer to FIGS. 12-13, which are schematic drawings illustrating a semiconductor structure provided by an eighth preferred embodiment of the present invention. As shown in FIGS. 12-13, the semiconductor structure provided by the preferred embodiment includes a plurality of first finger electrodes 710, a plurality of second finger electrodes 810, and a plurality of common finger electrodes 900 formed in a first layer 14 and a second layer 24. The first finger electrodes 710 are electrically connected to each other by a first electrode 712 and thus obtain a comb shape. In the same concept, the second finger electrodes 810 are electrically connected to each other by a second electrode 812 and thus obtain a comb shape, too. As shown in FIGS. 12-13, the common finger electrodes 900 and the first finger electrodes 710 are interdigitated to form a plurality of first units 700 in both of the first layer 14 and the second layer 24. The common finger electrodes 900 and the second finger electrodes 810 are also interdigitated to form a plurality of second units 800 in both of the first layer 14 and the second layer 24. It is noteworthy that the first units 700 formed in the first layer 14 and the second layer 24 have a same arrangement and locations, and the second units 800 formed in the first layer 14 and the second layer 24 have a same arrangement and locations, too. Furthermore, the first units 700 and the second units 800 formed in the first layer 14 are alternately arranged to form an array. The first units 700 and the second units 800 formed in the second layer 24 are also arranged to form an array. For example, the first units 700 in the first layer 14 and the second layer 24 are always adjacent to one of the second units 800. In other words, the first units 700 are diagonally arranged. In the same concept, the second units 800 in the first layer 14 and the second layer 24 are always adjacent to one of the first units. In other words, the second units 800 are diagonally arranged.

According to the preferred embodiment, a plurality of first via plugs 714, a plurality of second via plugs 814, and a plurality of third via plugs 914 (all shown in FIG. 13) are provided. The first via plugs 714 are used to electrically connect the first finger electrodes 710 formed in the first layer 14 and the second layer 24. The second via plugs 814 are used to electrically connect the second finger electrodes 810 formed in the first layer 14 and the second layer 24. And the third via plugs 914 are used to electrically connect the common finger electrodes 900 formed in the first layer 14 and the second layer 24. Therefore, the first units 700 in the first layer 14 and the second layer 24 are all electrically connected to form a first capacitor $C_1$, and the second units 800 in the first layer 14 and the second layer 24 are all are electrically connected to form a second capacitor $C_2$.

Please still refer to FIG. 12 and FIG. 13. The semiconductor structure provided by the preferred embodiment further includes a plurality of first connecting lines 730 formed in the first layer 14. The first connecting line 730 is used to electrically connect two nearest first finger electrodes 710 of different first units 700. The semiconductor structure provided by the preferred embodiment further includes a plurality of second connecting lines 830 formed in the second layer 24. The second connecting line 830 is used to electrically connect two nearest second finger electrodes 810 of different second units 800. It is noteworthy that the first connecting lines 730 are perpendicular to the first finger electrodes 710 and the second connecting lines 830 are perpendicular to the second finger electrodes 810. More important, the first connecting lines 730 formed in the first layer 14 are parallel with the second connecting lines 830 formed in the second layer 24.

According to the semiconductor structure provided by the preferred embodiment, the connecting lines that used to electrically connect the capacitor units 700/800 are parallel with or perpendicular to the finger electrodes and thus are different from the prior art, in which the connecting lines used to connect capacitor units are neither parallel with, nor perpendicular to the finger electrodes. In fact, the connecting lines and the finger electrodes often have an included angle of 45° in the prior art. Accordingly, the adverse impact rendered from the non-parallel and non-perpendicular designs for the connecting lines and the finger electrodes are avoided by the semiconductor structure provided by the preferred embodiment.

According to the semiconductor structures provided by present invention, the connecting lines used to electrically connect the finger electrodes are all parallel with each other, therefore the reliability of the capacitor is improved without adversely impacting the capacitor mismatch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
a plurality of first finger electrodes formed in a first layer and a second layer;
a plurality of second finger electrodes formed in the first layer and the second layer;
a plurality of common finger electrodes formed in the first layer and the second layer, the common finger electrodes and the first finger electrodes being interdigitated to form a plurality of first units in the first layer and the second layer, and the common finger electrodes and the second finger electrodes being interdigitated to form a plurality of second units in the first layer and the second layer;
a plurality of first connecting lines formed in the first layer, the first connecting lines being electrically connected to two nearest first finger electrodes of different first units; and
a plurality of second connecting lines formed in the second layer, the second connecting lines being electrically connected to two nearest second finger electrodes of different second units, and the first connecting lines and the second connecting lines being parallel with each other.

2. The semiconductor structure according to claim 1, wherein the first units and the second units are alternately arranged to form an array.

3. The semiconductor structure according to claim 1, wherein the first units formed in the first layer and the second layer are electrically connected to form a first capacitor, and the second units formed in the first layer and the second layer are electrically connected to form a second capacitor.

4. The semiconductor structure according to claim 1 further comprising:
a plurality of first via plugs electrically connected to the first finger electrodes formed in the first layer and the second layer;
a plurality of second via plugs electrically connected to the second finger electrodes formed in the first layer and the second layer; and
a plurality of third via plugs electrically connected to the common finger electrodes formed in the first layer and the second layer.

* * * * *